May 8, 1962 P. W. WOOD 3,034,070

MULTIVIBRATOR CONTROLLED OSCILLATOR

Filed Aug. 31, 1959

INVENTOR.
Paul W. Wood

BY
E. W. Christen

ATTORNEY

United States Patent Office 3,034,070

Patented May 8, 1962

3,034,070

MULTIVIBRATOR CONTROLLED OSCILLATOR

Paul W. Wood, Roseville, Mich., assignor to General Motors Corporation, Detroit, Mich., a corporation of Delaware Filed Aug. 31, 1959, Ser. No. 837,039
5 Claims. (Cl. 331—56)

This invention relates to a multivibrator circuit and more particularly to a multivibrator circuit having an oscillator in at least one of the stages.

In a transmission system using interrupted carrier wave it is necessary to control the point of initiation of oscillatory pulses and also to control the width of such pulses and their repetition rate. Also, it is often desirable in telemetering or instrumentation work to produce a series of spaced oscillatory bursts. These signals would consist of an interval of high frequency oscillations followed by an interval of oscillation of a different frequency or by a constant D.C. voltage. Such a signal might be employed when it is necessary to provide a sample of a steady state signal alternately with a condition responsive signal.

Previously it has been necessary in such systems to use an oscillator circuit that operates continuously in conjunction with a gating circuit which would have to be triggered by a multivibrator or some similar external trigger generator. The circuitry of this invention can perform the same function but will use far fewer circuit components and also will be less expensive and more reliable.

It is therefore the principal object of this invention to provide a multivibrator circuit with oscillator circuits in one or more of the stages to produce a series of spaced oscillatory signals. It is a further object of this invention to provide a multivibrator with oscillator circuits in one or both multivibrator stages whereby such stages will oscillate when rendered conductive but these oscillations will not alter the multivibrator switching action.

In accordance with this invention a standard multivibrator circuit is modified by adding a resonant circuit and a positive feedback path to at least one of the multivibrator stages to form a simple oscillator in place of such stages. In order to prevent the switching frequency of the multivibrator from being altered, the frequency of this resonant circuit is much greater than the normal repetition frequency of the basic multivibrator. Generally, a multivibrator type device may be of the free-running, monostable or bistable configuration and, in accordance with this invention, resonant circuits may be utilized in one or both stages of any of these circuits. The resonant circuits are connected such that they do not disturb the normal multivibrator switching action but merely provide positive feedback at the resonant frequency between the output and input of one of the multivibrator stages so that oscillations result when this particular stage is in its conductive state. When one of the stages having a resonant circuit is non-conductive then, of course, no oscillations occur since there is not sufficient gain to provide the necessary large positive feedback.

The novel features that are considered characteristic of this invention are set forth in the appended claims. The invention itself, as well as additional objects and advantages thereof, will best be understood from the following description of several embodiments of the invention when read in connection with the accompanying drawings, in which:

Figure 1:
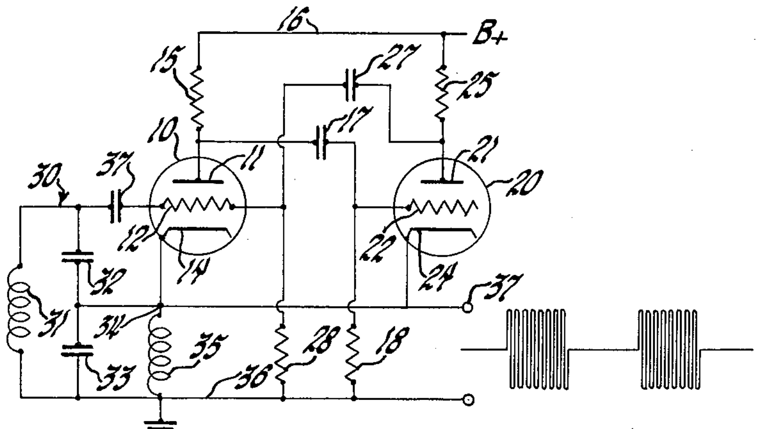
FIGURE 1 is a schematic diagram showing a free-running type multivibrator having an oscillatory circuit in one stage.

Referring now to the drawings and more particularly to FIGURE 1, a multivibrator circuit is shown having intercoupling circuits between the two stages that are of such a character that a free-running action results. The first stage of this multivibrator comprises an amplifier which may be a triode tube 10 as shown having a plate 11, a grid 12, and a cathode 14. This amplifying element could be another type of vacuum tube amplifier or could be a transistor stage. The plate 11 is supplied through a plate load resistor 15 from a plate supply line 16 which is connected to a suitable positive plate supply. The D.C. output of this stage is taken across the plate load resistor 15 and coupled by means of a capacitor 17 and a resistor 18 to the input of the following multivibrator stage which may be a triode vacuum tube 20 having a plate 21, a grid 22, and cathode 24. The plate 21 is likewise supplied through a plate load resistor 25 from the supply line 16. The D.C. output across the resistor 25 is coupled back to the grid 12 of the tube 10 by a coupling capacitor 27 and a resistor 28. Included in the grid-cathode circuit of the tube 10 is a tuned circuit which may take the form of a resonant circuit 30 having an inductor 31 and a pair of capacitive elements 32 and 33. The juncture of the capacitive elements 32, 33 is connected to a terminal 34 in the cathode circuit of tube 10. Plate current of the tube 10 flows through a radio frequency (R.F.) choke 35 in the cathode circuit to a grounded conductor 36. The high frequency output of the tube appears across the choke 35 at the terminal 34 and is coupled back by conductive means to the resonant circuit 30 at the juncture of the capacitors 32, 33 to provide the positive feedback necessary for oscillator action. The cathodes 14 and 24 of tubes 10 and 20, respectively, are connected together at the terminal 34 and so to the R.F. choke 35. The top of resonant circuit 30 is coupled by a grid biasing capacitor 37 to the grid 12. The output of this circuit would be taken across the R.F. choke 35, or, in other words, between an output terminal 37 and the grounded conductor 36 and would be a waveform as shown in the drawing adjacent the output terminal.

In the operation of the circuit shown in FIGURE 1, the plate current of the tube 10 will be assumed to be increasing. This will result in a decrease in the voltage on plate 11 across the load resistor 15. The capacitor 17, having been previously charged to the high voltage on the plate 11, will now discharge through the tube 10 resulting in a negative voltage drop across the resistor 18 and likewise a negative potential on the grid 22. This will cause a decrease in the plate current of the tube 20 and an increase of the potential of the pate 21 which will in turn be coupled back to the grid 12 by the capacitor 27 and resistor 28. The cumulative result of this cross coupling will be a condition whereby the tube 10 will be conducting heavily and the tube 20 will be cut off.

Any positive voltage that may result on the grid 12 will cause the tube 10 to draw grid current and charge the grid biasing network which comprises the capacitor 27 and the resistor 28. A point is reached during the charging of the biasing network where proper bias is obtained in the grid-cathode circuit of the tube 10 to sustain oscillations produced by the resonant circuit 30 in conjunction with the amplifier stage 10. The grid biasing network provides the proper bias for class C operation and prevents the tube 10 from going into the saturation region except momentarily. The peak-to-peak magnitude of the sine wave oscillations present across the tube 10 will be less than the voltage change on the plate 11 resulting from the multivibrator switching action. Due to the R.F. choke 35, very little high frequency current will flow in the plate circuit and so the amount of high frequency potential present on the plate 11 will not be sufficient to initiate conduction in the tube 20. The average plate current in the tube 10, however, will be sufficient to promote the multivibrator switching action.

When the capacitor 17 has completely discharged to the potential of the plate 11 through the resistor 18, then the negative bias no longer exists on the grid 22 and the tube 20 again begins to conduct. The voltage on the plate 21 decreases due to the increased drop across the resistor 25 and this results in a negative voltage on the grid 12 due to the coupling network including the capacitor 27 and the resistor 28. The mode of operation will then reverse itself due to the cross coupling and will result in a condition whereby the tube 20 is conducting heavily and the tube 10 is cut off. Since there is no longer sufficient gain to provide the necessary positive feedback between the output circuit of tube 10 and its input through the resonant circuit 30, then oscillations can no longer be sustained. The complete cycle will repeat itself at a repetition rate determined by the values of the components in the coupling circuits including the capacitors 17, 27 and the resistors 18, 28.

The output of the system is taken across the R.F. choke 35 and the output signal obtained will exhibit an interval of sine wave oscillation during the time that the tube 10 is conducting followed by an interval of substantially zero D.C. potential during the interval that the tube 20 is conducting. The frequency of the sine wave oscillations will, of course, be determined by the resonant frequency of the circuit 30. If this frequency is selected to be much greater than the repetition frequency of the multivibrator switching action, then the oscillations will stabilize relatively soon after the tube 10 begins to conduct and provide a constant frequency output for the remainder of the interval of conduction. By using variable circuit elements in the resonant circuit 30 the system can be employed as a modulator-oscillator. Also by making one or both of the coupling capacitors 17, 27 a condition responsive element then the system may be used as a pulse width or repetition rate modulator.

Figure 2:
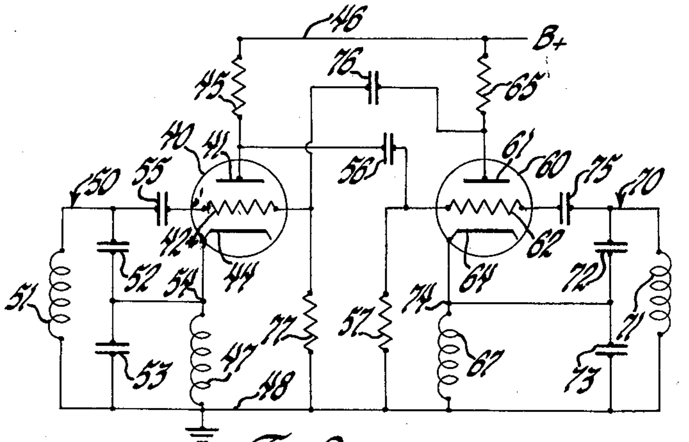
FIGURE 2 is a schematic diagram of a free-running type multivibrator having oscillatory circuits in both stages.

Referring now to FIGURE 2, a free-running type multivibrator is shown wherein resonant circuits are used in both of the amplifier stages. A triode amplifier tube 40 is shown having a plate or anode electrode 41, a grid or control electrode 42 and a cathode 44. Plate supply is obtained through a load resistor 45 from a supply line 46. The cathode 44 is connected through an R.F. choke 47 to a grounded conductor 48. A resonant circuit 50 is provided in the grid-cathode circuit whereby an inductor 51 and a pair of capacitors 52, 53 make up the frequency determining elements of the oscillator stage. The juncture of the capacitors 52, 53 is coupled to a terminal 54 in the cathode circuit of the tube 40 and the juncture of the inductor 51 and the capacitor 52 is coupled by a grid biasing capacitor 55 to the grid 42. The plate 41 is coupled by a capacitance 56 and a resistance 57 to the input of the following triode amplifier tube 60. The tube 60 comprises a plate 61, a grid 62 and a cathode 64 and a plate load resistor 65 connects the plate 61 to the supply line 46. A resonant circuit 70 similar in character to the resonant circuit 50 and comprising an inductor 71 and a pair of capacitors 72, 73 is connected in the grid-cathode circuit of the tube 60. A coupling circuit comprising a capacitor 76 and a resistor 77 is connected between the plate 61 and the grid 42. An R.F. choke 67 is connected in the cathode circuit in a manner similar to that of the preceding stage. The juncture of the capacitors 72, 73 is coupled to a terminal 74 in the cathode circuit.

The operation of this circuit of FIGURE 2 is very similar to that of the circuit of FIGURE 1 with respect to the multivibrator switching action. The tubes 40 and 60 are rendered alternately conductive and non-conductive at a repetition frequency determined by the cross coupling circuits comprising the capacitors 56, 76 and the resistors 57, 77. When the stage including the tube 40 is rendered conductive then a sine wave oscillation will result at a frequency determined by the values of the inductor 51 and capacitors 52, 53 in the resonant circuit 50. In a like manner, the circuit of the triode tube 60 will oscillate at a frequency determined by the resonant circuit 70 when it is in turn rendered conductive. The output of this system may be taken by a suitable coupling means from across one or both of the R.F. chokes 47 and 67, that is, from the terminals 54 or 74. The output signal would be first a sine wave oscillation of a frequency determined by resonant circuit 50 and of an interval determined by the values of the capacitor 56 and the resistor 57, and then a sine wave oscillation of a frequency determined by resonant circuit 70 and of an interval determined by the values of the capacitor 76 and the resistor 77.

Figure 3:
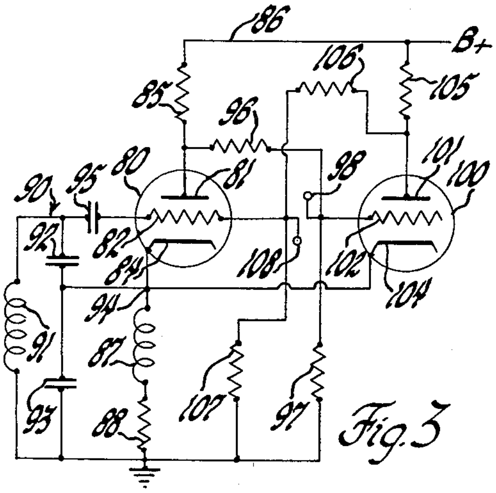
FIGURE 3 is a schematic diagram of a bistable type multivibrator circuit having an oscillatory circuit in one stage.

The circuit shown in FIGURE 3 is a simple bistable type multivibrator circuit that has been modified to include an oscillator as one of the multivibrator stages. This circuit differs from that of FIGURE 1 primarily in the type of cross coupling circuits employed. A triode amplifier tube 80, having a plate 81, a grid 82 and a cathode 84, is employed to provide the necessary gain for the oscillator and multivibrator action. The plate 81 is supplied through a load resistor 85 from a supply line 86. The cathode 84 is connected through an R.F. choke 87 and a common cathode biasing resistor 88 to ground potential. A resonant circuit 90 interconnecting the output and input of stage 80 includes an inductor 91 and capacitors 92 and 93. The juncture of capacitors 92, 93 is connected to a terminal 94 which is at cathode potential. A grid biasing capacitor 95 couples the resonant circuit to the grid 82. The plate potential of stage 80 is directly coupled to the input of the following stage by a voltage divider comprising a pair of resistors 96, 97. The following stage employs a triode amplifier tube 100 having a plate 101, a grid 102 and a cathode 104 and this stage is likewise supplied through a plate resistor 105 from the line 86. The plate 101 of this stage is coupled to the input of the preceding stage, the grid 82, by a voltage divider comprising a pair of resistors 106, 107. Coupling means may be provided for applying positive or negative switching pulses from an external trigger source to the grids 82 and 102 at an input terminal 98 or an input terminal 108. An output signal would be coupled from the terminal 94 in any conventional manner.

In the operation of the circuit of FIGURE 3, it will be assumed that the tube 100 is conducting heavily. The plate current of this stage will flow through the common cathode resistor 88 resulting in a relatively high potential on the cathode 84. Due to the low voltage on the plate 101, the potential on the grid 82 will be relatively low compared to that of the cathode 84 resulting in a condition of near cut off in the tube 80. The resulting high potential on the plate 81 being coupled to the grid 102 will produce a tendency for the tube 100 to conduct more heavily which will further inhibit the conduction of the tube 80. This condition will continue until a large negative pulse is applied by external means to the grid 102 or a large positive pulse is applied to the grid 82. When either of these events occur, the conductive conditions will be reversed by the usual bistable multivibrator switching action so that stage 80 will conduct heavily and the necessary gain will be present to produce oscillations of frequency determined by the resonant circuit 90.

The output of the circuit of FIGURE 3 is taken from the common cathode circuit at terminal 94 and will be of a character similar to that of the free-running circuit of FIGURE 1 except that the points of initiation and termination of the oscillatory intervals are controlled by the external positive and negative pulses that are applied to the grids 82 and 102 rather than being determined by the cross coupling circuits. A second resonant circuit may be added to the bistable configuration to produce a circuit analogous to that shown in FIGURE 2. This will provide an output which exhibits alternate oscillatory intervals at a repetition or switching frequency that is determined by some external triggering pulse.

Figure 4:
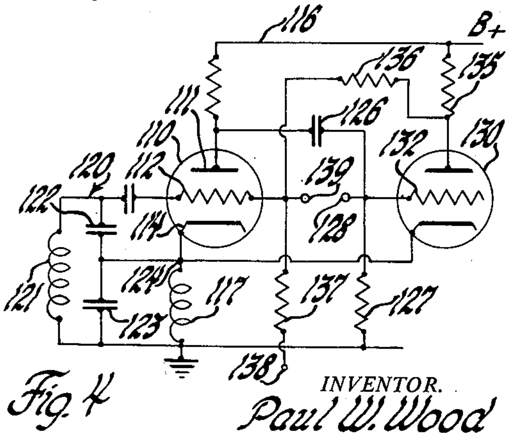
FIGURE 4 is a schematic diagram of a monostable type multivibrator circuit having an oscillatory circuit in one stage.

The circuit shown in FIGURE 4 is a monostable type multivibrator having an oscillator in one of its stages. The multivibrator is of standard configuration when considered apart from the oscillatory or resonant circuit. The circuit of FIG. 4 is similar in all respects to that of FIG. 1 except for the type of cross coupling employed. A triode amplifier tube 110 is shown having a plate 111, a grid 112 and a cathode 114. The plate is supplied through a load resistor 115 from a supply line 116 that is connected to a suitable positive plate supply source. The cathode is connected to ground through an R.F. choke 117. A resonant circuit 120 including an inductor 121 and a pair of capacitors 122, 123 is shown interconnecting the output and input of the tube 110 in a manner similar to that shown in FIGURE 1. The output from the plate 111 is coupled to the grid of the following stage by a capacitor 126 and a resistor 127. The following stage comprises a triode tube 130 which utilizes a plate load resistor 135 and the voltage drop across this resistor is directly coupled by a resistor 136 to the grid 112. This grid 112 is further connected by a biasing resistor 137 to a source of negative grid voltage supply 138. This biasing arrangement for grid 112 is sufficient to maintain the stage 110 in a normally cut off condition. Coupling means may be provided for applying a negative switching pulse to the grid 132 or a positive switching pulse to the grid 112 at the input terminals 128 and 139. These switching pulses would be obtained from an external source.

In the operation of the circuit shown in FIGURE 4, the triode 130 will normally conduct heavily since its grid is essentially at cathode potential. The triode 110 will be normally cut off due to the grid biasing arrangement including the resistors 136, 137 and the grid supply 138. This steady state condition may be altered by a large positive pulse being coupled to the grid 112 or by a large negative pulse being coupled to the grid 132. Either of these actions will result in the switching of the conducting state from the tube 130 to the tube 110 due to the standard monostable or one-shot type of cross coupling used in the multivibrator stages. The stage 110 will then oscillate at a frequency determined by the resonant circuit 120, and will continue to do so until the capacitor 126 has discharged through the resistor 127 and through the tube 110. The output of this system is taken from a terminal 124 in the cathode circuit of tube 110 across the R.F. choke 117 and will exhibit a condition of substantially zero potential up to the point where the stage 110 is rendered conductive and oscillations begin. The output will be an oscillatory signal of a frequency determined by the resonant circuit 120 for an interval determined by the coupling network including the capacitor 126 and resistor 127 and will then return to zero until the cycle is again initiated by an external trigger pulse on one of the grids 112, 132.

The circuit of FIGURE 4 may be modified to include an oscillator circuit in both stages in a manner similar to the circuit of FIGURE 2. The output provided by such a system would be a constant frequency signal that switches to a second constant frequency at some point determined by an external trigger pulse, remains at this second frequency for a period determined by the cross coupling network, and then returns to the steady state frequency.

Although this invention has been described with respect to several particular embodiments thereof, it is not to be so limited as changes and modifications may be made therein which are within the full intended scope of the invention as defined by the appended claims.

What is claimed as my invention is:

1. A free-running multivibrator circuit including, in combination, a first triode having a plate, a grid, and a cathode, a first output circuit connected between the plate and cathode of said first triode and comprising a first plate load impedance and a cathode load inductor, a second triode having a plate, a grid, and a cathode, a second output circuit connected between the plate and cathode of said second triode and comprising a second plate load impedance and said cathode load inductor, first coupling means connecting the plate of said first triode to the grid of said second triode, second coupling means connecting the plate of said second triode to the grid of said first triode such that said triodes will be rendered alternately conductive by a free-running multivibrator switching action at a repetition frequency determined by the circuit constants of said first and second coupling means, a resonant circuit interconnecting said cathode load inductor and the grid of said first triode whereby said first triode when rendered conductive will operate as an oscillator to produce oscillations of a frequency determined by said resonant circuit, said oscillator frequency being appreciably greater than said repetition frequency, said repetition frequency being substantially independent of said oscillator frequency, and output terminals connected across said cathode load inductor.

2. A free-running multivibrator circuit including, in combination, a first triode having a plate, a grid, and a cathode, a first output circuit connected between the plate and cathode of said first triode and comprising a plate load impedance and a first cathode load inductor, a second triode having a plate, a grid, and a cathode, a second output circuit connected between the plate and cathode of said second triode and comprising a plate load impedance and a second cathode load inductor, first coupling means connecting the plate of said first triode to the grid of said second triode, second coupling means connecting the plate of said second triode to the grid of said first triode such that said triodes will be rendered alternately conductive at a repetition frequency determined by the circuit constants of said first and second coupling means, a first resonant circuit interconnecting said first cathode load inductor and the grid of said first triode whereby said first triode will operate as an oscillator to produce oscillations of a first frequency when rendered conductive, a second resonant circuit interconnecting said second cathode load inductor and the grid of said second triode whereby said second triode will operate as an oscillator to produce oscillations of a second frequency when rendered conductive, said first frequency and said second frequency being appreciably greater than said repetition frequency, and output terminals operatively connected to at least one of said first and second cathode load inductors.

3. A bistable multivibrator circuit including, in combination, a first triode having a plate, a grid, and a cathode, a first output circuit connected between the plate and cathode of said first triode and comprising a first plate load impedance and a cathode load inductor, a second triode having a plate, a grid, and a cathode, a second output circuit connected between the plate and cathode of said second triode and comprising a second plate load impedance and said cathode load inductor, first coupling and biasing means connecting the plate of said first triode to the grid of said second triode, second coupling and biasing means connecting the plate of said second triode to the grid of said first triode such that said triodes will be rendered alternately conductive according to a bistable multivibrator switching action, a resonant circuit interconnecting said cathode load inductor and the grid of said first triode whereby said first triode will operate as an oscillator to produce oscillations of a frequency determined by said resonant circuit when rendered conductive, the impedance of said inductor at said frequency being large relative to said plate load impedances, said switching action being substantially independent of said oscillations, and output terminals connected across said cathode load inductor.

4. A monostable multivibrator circuit including, in combination, a first triode having a plate, a grid, and a cathode, a first output circuit connected between the plate and cathode of said first triode and comprising a plate load impedance and a cathode load inductor, a second triode having a plate, a grid, and a cathode, a second output circuit connected between the plate and cathode of said second triode and comprising a plate load impedance and said cathode load inductor, first coupling means connecting the plate of said first triode to the grid of said second triode, second coupling means connecting the plate of said second triode to the grid of said first triode, biasing means connected to the grids of said triodes such that said first triode is normally non-conductive and said second triode is normally conductive, said coupling means and said biasing means being effective to provide a monostable multivibrator switching action, a resonant circuit interconnecting said cathode load inductor and the grid of said first triode whereby said first triode will operate as an oscillator to produce oscillations of a frequency determined by said resonant circuit when rendered conductive, and output terminals connected across said cathode load inductor.

5. A multivibrator circuit including, in combination, a first triode having a plate, a grid, and a cathode, a plate load impedance connected between the plate of said first triode and one terminal of a voltage supply, an R.F. choke connected between the cathode of said first triode and the other terminal of said voltage supply, a second triode having a plate, a grid, and a cathode, a plate load impedance connected between the plate of said second triode and said voltage supply, the cathode of said second triode being connected to said R.F. choke, first coupling means connecting the plate of said first triode to the grid of said second triode, second coupling means connecting the plate of said second triode to the grid of said first triode such that conduction of one of said triodes will tend to prevent conduction of the other triode, a resonant circuit interconnecting said R.F. choke and the grid of said first triode whereby said first triode will operate as an oscillator to produce R.F. oscillations when rendered conductive, and output terminals connected across said R.F. choke.

References Cited in the file of this patent

UNITED STATES PATENTS

| | | |
|---|---|---|
| 2,494,321 | Usselman | Jan. 10, 1950 |
| 2,553,165 | Bliss | May 15, 1951 |
| 2,647,172 | Jeanlin | July 28, 1953 |
| 2,728,856 | Hannum et al. | Dec. 27, 1955 |